US008221945B2

(12) United States Patent
Shirasaki et al.

(10) Patent No.: US 8,221,945 B2
(45) Date of Patent: Jul. 17, 2012

(54) PELLICLE FRAME AND LITHOGRAPHIC PELLICLE

(75) Inventors: Toru Shirasaki, Gunma (JP); Kishore Chakravorty, Santa Clara, CA (US); David Mushell, Santa Clara, CA (US); Grace Ng, Santa Clara, CA (US)

(73) Assignees: Shin-Etsu Chemical Co., Ltd., Tokyo (JP); Intel Corporation, Santa Clara, CA (US)

( * ) Notice: Subject to any disclaimer, the term of this patent is extended or adjusted under 35 U.S.C. 154(b) by 208 days.

(21) Appl. No.: 12/819,536

(22) Filed: Jun. 21, 2010

(65) Prior Publication Data

US 2010/0330467 A1    Dec. 30, 2010

(30) Foreign Application Priority Data

Jun. 24, 2009  (JP) .................................. 2009-149777

(51) Int. Cl.
*G03F 1/62* (2012.01)
*G03F 1/64* (2012.01)

(52) U.S. Cl. ............................................................ 430/5

(58) Field of Classification Search ......... 430/5; 428/14
See application file for complete search history.

(56) References Cited

FOREIGN PATENT DOCUMENTS

| JP | 9-68793 | 3/1997 |
|---|---|---|
| JP | 2009-25562 A1 | 2/2009 |

*Primary Examiner* — Stephen Rosasco
(74) *Attorney, Agent, or Firm* — Kratz, Quintos & Hanson, LLP

(57) ABSTRACT

A pellicle frame is provided that includes a pellicle frame bar having a cross-section with a shape that has a curved line-containing recess in at least one side edge of a quadrilateral having an upper edge and a lower edge parallel to each other and an area of no greater than 20 mm$^2$.

20 Claims, 3 Drawing Sheets

PELLICLE FRAME AND LITHOGRAPHIC PELLICLE

BACKGROUND OF THE INVENTION

1. Field of the Invention

The present invention relates to a pellicle frame and a lithographic pellicle used as a debris shield for a lithography mask when producing a liquid crystal display panel or a semiconductor device such as an LSI or a ULSI.

2. Description of the Related Art

In the production of a semiconductor such as an LSI or a ULSI or the production of a liquid crystal display panel, a pattern is formed by irradiating a semiconductor wafer or a liquid crystal master plate with light; if debris is attached to an exposure master plate, since the debris absorbs the light or refracts the light, there are problems that the replicated pattern is deformed, the edges become rough, or the background is stained black, thus impairing the dimensions, quality, appearance, etc. The 'exposure master plate' referred to in the present invention is a general term for lithography masks (also called simply 'masks') and reticles. The explanation below is given for a mask as an example.

These operations are usually carried out in a clean room, but even within a clean room it is difficult to always keep the exposure master plate clean, and a method is therefore employed in which a pellicle film that allows exposure light to easily pass through is affixed to the surface of the exposure master plate to act as a debris shield.

The pellicle is basically constituted of a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, etc.) to easily pass through. The pellicle film is adhered by coating the upper end part of the pellicle frame with a good solvent for the pellicle film and air-drying or by means of an adhesive such as an acrylic resin, an epoxy resin, or a fluorine resin. Furthermore, in order to mount an exposure master plate, a lower end part of the pellicle frame is provided with a pressure-sensitive adhesion layer made of a polybutene resin, a polyvinyl acetate resin, an acrylic resin, a silicon resin, etc. and a reticle pressure-sensitive adhesive protecting liner for the purpose of protecting the pressure-sensitive adhesive layer.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

In recent years, the LSI design rule has shrunk to sub-quarter micron, and accompanying this the wavelength of the exposure light source is being shortened, that is, instead of g rays (436 nm) and i rays (365 nm) from the hitherto predominant mercury lamp, a KrF excimer laser (248 nm), an ArF excimer laser (193 nm), etc. are being used. As shrinkage advances, the flatness required for the mask and silicon wafer becomes more strict.

A pellicle is affixed to a mask in order to shield the pattern from debris after the mask is completed. When a pellicle is affixed to the mask, the mask flatness can sometimes change. When the mask flatness is degraded, as described above there is the possibility that problems such as defocusing will occur. Furthermore, when the flatness changes, the pattern shape drawn on the mask changes, and this brings about the difficulty that problems occur with the precision of superimposition of the mask.

There are several factors involved in the change in mask flatness due to a pellicle being affixed, but it has been found that the largest factor is the flatness of the pellicle frame.

In order to prevent deformation of a mask due to deformation of a pellicle frame, JP-A-2009-25562 (JP-A denotes a Japanese unexamined patent application publication) discloses reducing the cross-sectional area of the pellicle frame to 6 mm² or less or using a material having a Young's modulus of 50 GPa or less in the pellicle frame.

Many pellicle frames have a rectangular cross-sectional shape, and JP-A-9-68793 discloses a pellicle frame for which the cross-section has a shape in which an upper end side of an inner peripheral face projects further inward than a lower end side.

BRIEF SUMMARY OF THE INVENTION

In recent years, with regard to the flatness required for a mask, from a flatness of 2 μm on the pattern face the requirement is gradually becoming more strict, and for the 65 nm node process and beyond, 0.5 μm or less and preferably 0.25 μm or less is now required.

In general, the flatness of a pellicle frame is in the order of 20 to 80 μm, but if a pellicle employing a pellicle frame having poorer flatness than a mask is affixed to the mask, the shape of the frame is transferred to the mask, thus causing deformation in the mask. When affixing, the pellicle is pressed against the mask with a large force of about 200 to 400 N (20 to 40 kgf). Since the flatness of the mask surface is better than the flatness of the pellicle frame, when pressing of the pellicle against the mask is completed, the pellicle frame attempts to return to its original shape, and the pellicle frame thereby causes the mask to deform.

It is a first object of the present invention to provide a pellicle frame that can suppress deformation of an exposure master plate due to deformation of the pellicle frame even if a pellicle is affixed to the exposure master plate. It is a second object of the present invention to provide a lithographic pellicle having such a pellicle frame.

The above-mentioned objects of the present invention have been accomplished by means (1) and (10) below. They are described together with (2) to (9), which are preferred embodiments.

(1) A pellicle frame comprising a pellicle frame bar having a cross-section with a shape that has a curved line-containing recess in at least one side edge of a quadrilateral having an upper edge and a lower edge parallel to each other and a cross-sectional area of no greater than 20 mm².

(2) The pellicle frame according to (1), wherein the quadrilateral is a rectangle and the curved line is selected from convex curved lines formed from a circle, an ellipse, a hyperbola, and a parabola.

(3) The pellicle frame according to (1) or (2), wherein the recess is formed only from a convex curved line.

(4) The pellicle frame according to (1) or (2), wherein the recess includes at least one straight line.

(5) The pellicle frame according to (4), wherein the recess includes at least one straight line parallel to the upper edge of the rectangle.

(6) The pellicle frame according to any one of (1) to (5), wherein the pellicle frame bar has a cross-sectional area of at least 0 mm² but no greater than 6 mm².

(7) The pellicle frame according to any one of (1) to (6), wherein the pellicle frame bar is formed from a material having a Young's modulus of 1 to 80 GPa.

(8) The pellicle frame according to any one of (1) to (7), wherein the pellicle frame bar is formed from a material selected from the group consisting of an aluminum alloy, a magnesium alloy, and a polycarbonate resin.

(9) The pellicle frame according to any one of (1) to (8), wherein the pellicle frame bar is formed from an aluminum alloy.

(10) The pellicle frame according to any one of (1) to (9), wherein the quadrilateral has an area of at least 4 mm² but no greater than 20 µm.

(11) The pellicle frame according to any one of (1) to (10), wherein the pellicle frame has a flatness of at least 0 µm but no greater than 20 µm.

(12) A lithographic pellicle comprising a pellicle film stretched over one end face of the pellicle frame according to any one of (1) to (11) via a pellicle film adhesive, and comprising an exposure master plate adhesive on the other end face.

In this invention a curved line-containing recess means a recess containing a curved line contour.

In accordance with the present invention, there can be provided a pellicle frame and a lithographic pellicle that can suppress deformation of an exposure master plate due to deformation of a pellicle frame.

EXPLANATION OF REFERENCE NUMERALS AND SYMBOLS

| | |
|---|---|
| 1: | Pellicle film |
| 2: | Adhesion layer |
| 3: | Pellicle frame |
| 4: | Pressure-sensitive adhesion layer |
| 5: | Exposure master plate |
| 10: | Pellicle |
| 12: | Upper edge |
| 13: | Upper end part |
| 14: | Lower edge |
| 15: | Lower end part |
| 16: | Middle part |
| 17: | Side edge |
| 18: | Curved line-containing recess |
| 19: | Side edge |

DETAILED DESCRIPTION OF THE INVENTION

The pellicle frame of the present invention comprises a pellicle frame bar having a cross-section with a shape that has a curved line-containing recess in at least one side edge of a quadrilateral having an upper edge and a lower edge parallel to each other and an area of no greater than 20 mm².

The present invention is explained by referring to figures.

Figure 1:
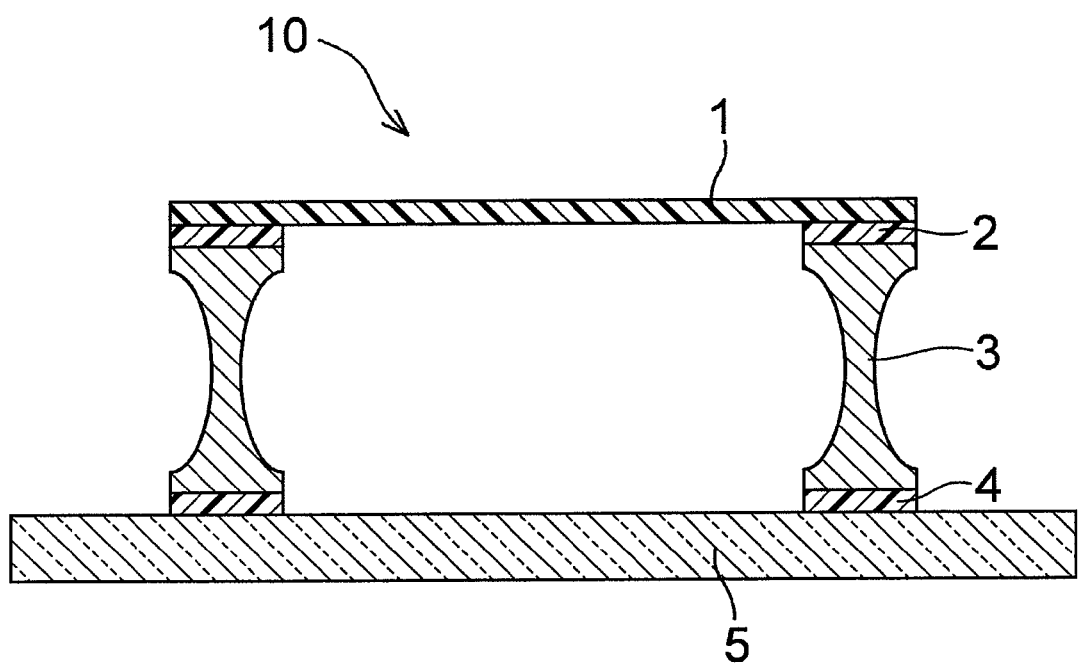
FIG. 1 An example of a schematic cross-sectional diagram showing a constitutional example of a pellicle.

As shown in FIG. 1 as a cross-sectional shape, a lithographic pellicle 10 of the present invention is formed by stretching a pellicle film 1 over an upper end face of a pellicle frame 3 via an adhesion layer 2 for affixing the pellicle film. In this case, a pressure-sensitive adhesion layer 4 for adhering the lithographic pellicle 10 to an exposure master plate (mask or reticle) 5 is usually formed on a lower end face of the pellicle frame 3, and a liner (not illustrated) is detachably adhered to a lower end face of the pressure-sensitive adhesion layer 4. The pellicle frame 3 may be provided with an atmospheric pressure adjustment hole (vent) (not illustrated) and, furthermore, this vent may be provided with a dust filter (not illustrated) for the purpose of removing particles.

The pellicle frame may be provided with a jig hole. The shape of the jig hole in the depth direction is not specified, and may be a recess having a taper at the extremity of a column as long as it does not pass completely through.

The cross sectional shape of the position where the atmospheric pressure adjustment hole and the jig hole are provided is preferably a quadrilateral before providing a convex curve-containing recess, and is more preferably a rectangle.

Figure 2:
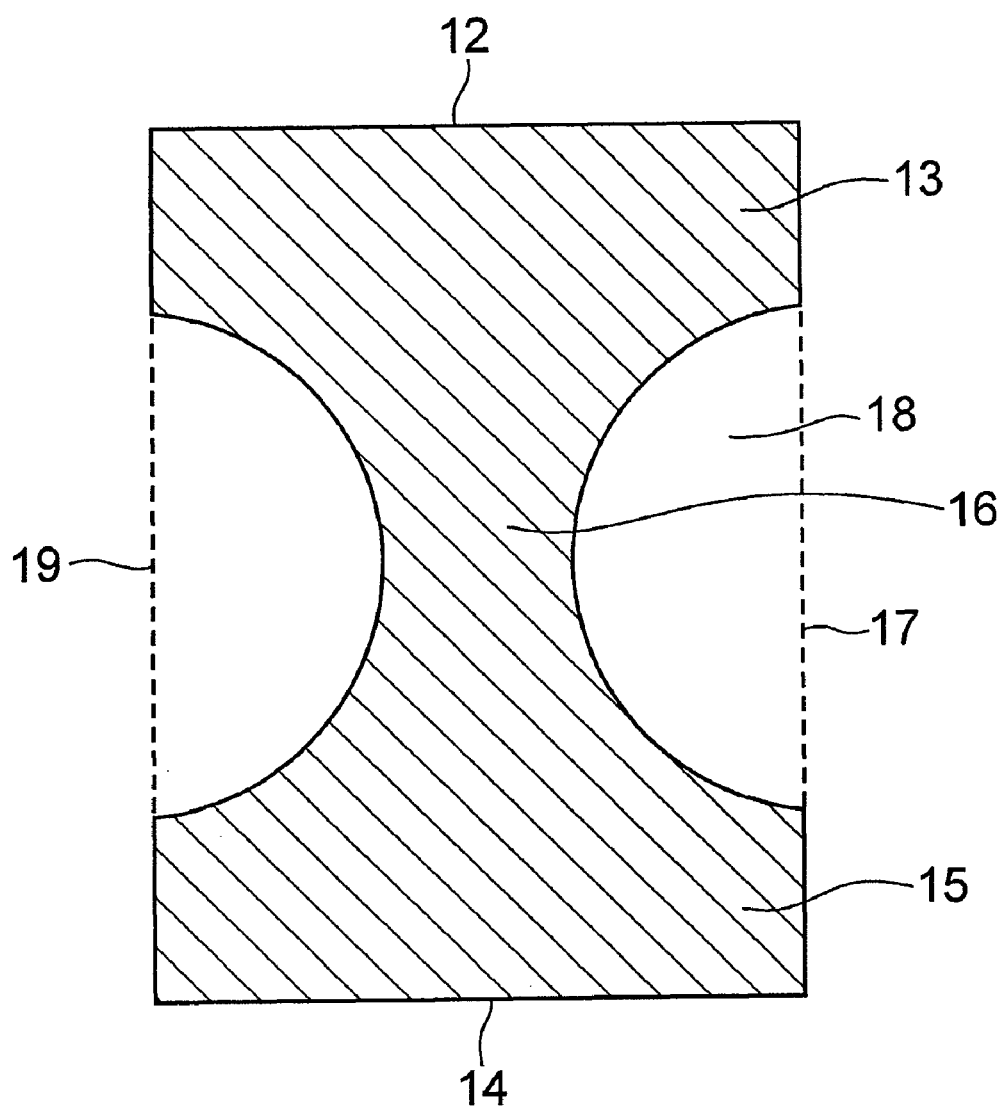
FIG. 2 A diagram showing one example of the cross-sectional shape of a pellicle frame bar.

As shown in FIG. 2, with regard to the pellicle frame of the present invention, the cross-section of the pellicle frame bar has a shape that has a curved line-containing recess at least one of side edges 17 and 19 opposing each other, of a quadrilateral as a basis having an upper edge 12 and a lower edge 14 parallel to each other and an area of no greater than 20 mm² (hereinafter, also called a 'basic quadrilateral'; formed from the four edges 12, 17, 14, and 19). The cross-section of the pellicle frame has a shape in which an upper end part 13 containing an upper edge 12 and a lower end part 15 containing a lower edge 14 are connected by a middle part 16 formed by the convex curve-containing recess in the basic quadrilateral.

As hereinbefore described, it is thought that distortion of a mask caused by affixing a pellicle to the mask is mainly due to distortion of the pellicle frame of the pellicle. When affixing, the pellicle frame is deformed, and deformation stress caused by it returning to its original shape makes the mask deform. This deformation stress depends on the Young's modulus and the amount of deformation of the material constituting the pellicle frame. In accordance with the present invention, it becomes possible by reducing the cross-sectional area of the pellicle frame to less than that of the basic quadrilateral to provide a pellicle frame for which the deformation stress when affixing the pellicle to a mask is small. Conventionally, since a pellicle film is stretched over an upper edge of the pellicle frame and the mask is adhered to the lower edge by providing a pressure-sensitive adhesive, it is necessary for the upper edge and the lower edge to have a certain degree of width. Therefore, the conventional pellicle frame having a rectangular cross-section has large deformation stress. However, in accordance with the present invention, a middle part connecting an upper end part and a lower end part can be made to have a narrower width than both the upper and lower edges by providing recesses in opposite side faces.

Such a pellicle frame bar may be produced by cutting, in a frame having a cross-section with the basic quadrilateral shape, a shape having a curved line-containing recess from at least one of opposing side edges of the quadrilateral. The position on the pellicle frame bar where the atmospheric pressure adjustment hole or the jig hole is provided may be free from a recess, and the position on the pellicle frame where the jig hole is provided is preferably free from cutting so that the jig hole is not a through hole.

Furthermore, as an alternative method, the above-mentioned pellicle frame may be produced by injection molding of an engineering plastic into a mold having a predetermined cross-sectional shape.

The basic quadrilateral shape is not limited as long as the upper edge and the lower edge are parallel to each other; the basic quadrilateral includes a rectangle, including a square, a trapezoid, and a parallelogram, and among them a rectangle is preferable. With regard to a trapezoid, the upper edge may be shorter or longer than the lower edge.

The area of the basic quadrilateral is no greater than 20 mm$^2$. When it exceeds 20 mm$^2$, since there is a limit, in terms of equipment, for increasing the height of the frame, the frame width becomes too large, and the inner dimensions of the pellicle become too small, thus causing the problem that the pattern area is greatly restricted.

The area of the basic quadrilateral is preferably no greater than 15 mm$^2$, and more preferably no greater than 12 mm$^2$. Furthermore, the area of the basic quadrilateral is preferably at least 2 mm$^2$, and more preferably at least 4 mm$^2$. When it is within the above-mentioned range of values, there is the advantage that, since the frame width can be suppressed so as to be thin, a sufficient pattern area can be obtained.

In the present invention, the recess may have a shape containing a concave/convex curved line, preferably a shape containing a curved line that is convex or concave in one direction, and more preferably a shape in which this curved line is selected from convex curved lines formed from a circle, an ellipse, a hyperbola, and a parabola.

The convex curved line-containing recess is preferably formed only from a convex curved line. Examples of shapes formed only from a convex curved line include a semicircle, a partial circle, a semiellipse, a partial ellipse, a partial hyperbola, and a partial parabola. With regard to the partial shape of the conic curve of the ellipse, hyperbola, and parabola, a partial curved line including the vicinity of the apex thereof is preferable. The convex curved line contained in the recess may be convex or concave from the side edge toward the inside.

In the present invention, it is also preferable for the recess to include the above-mentioned convex curved line and at least one straight line. Examples of the shape of such a recess include an arcuate shape bounded by the above-mentioned convex curved line and a straight line intersecting the convex curved line as a chord, and a shape containing the above-mentioned convex curved line and at least one straight line. Examples of the latter include a quarter circle and a quarter ellipse. It is also preferable for the above-mentioned recess to contain at least one straight line that is parallel to the upper edge. The recess may also be convex toward the side edge and contain two straight lines that are parallel to the upper edge.

The basic quadrilateral shape has an upper edge and a lower edge parallel to each other. This quadrilateral includes a rectangle, including a square, a trapezoid, and a parallelogram, and a rectangle is preferable. With regard to the trapezoid, the upper edge may be shorter or longer than the lower edge.

The pellicle frame of the present invention preferably has a predetermined thickness in the vertical direction at opposite sides of the upper end part and the lower end part.

Furthermore, the cross-section of the pellicle frame bar of the present invention has a convex curved line-containing recess, but a shape in which a given curved line portion is replaced by a hexagonal or higher polygon approximating to this curved line may be used as an equivalent in the same manner.

The cross-sectional shape of the pellicle frame bar is explained by reference to FIG. 3.

The shape of (a) is one shape of the cross-section of the pellicle frame directed to the present invention, and is a shape in which both side edges of a vertical rectangle, which is the basic quadrilateral having an upper edge and a lower edge parallel to each other and an area of no greater than 20 mm$^2$, have a partial circle recess in substantially the middle thereof, and an upper end part 13 and a lower end part 15 are connected by a middle part 16, which has a small width in its middle.

The shape of (b) has a semicircular recess in only one side edge of a rectangle as the basic quadrilateral.

The shape of (c) has a quarter-circle recess in one side edge of a rectangle, and a straight line portion is parallel to the upper edge.

The shape of (d) has partial circle recesses in both side edges of a rectangle, and straight line portions are both parallel to the upper edge.

The shape of (e) has a recess, formed from a slightly concave curved line and two straight lines, from one side edge of a rectangle.

Among the above-mentioned cross-sectional shape examples, from the viewpoint of low deformation stress, (a) and (d) are preferable, and (d) is more preferable.

Modification to a shape having a parallelogram or a trapezoid as the basic quadrilateral and having a convex curved line-containing recess from both side edges or one side edge thereof is also possible.

With regard to the middle part, the middle part of the upper end part and the lower end part has a region with a narrow width, but as shown in (c) above the middle part may have a broad width closer to the upper end part or the lower end part.

The pellicle frame of the present invention is designed as to be appropriate according to the shape of the mask; the plan (top view) shape of the pellicle frame is usually a ring shape, a rectangular shape, or a square shape, and it has a size and a shape that covers a circuit pattern part provided on the mask. A corner of a pellicle frame having a rectangular shape (including a square) may be chamfered with a curved face or one or more flat faces.

The height of the pellicle frame is preferably about 1 to 10 mm, more preferably about 2 to 7 mm, and particularly preferably about 3 to 6 mm. The width of the upper edge and the lower edge of the pellicle frame is preferably 1 to 3 mm, and a width of about 2 mm is preferable in terms of general purpose features.

The thickness of the upper end part and/or the lower end part is preferably at least 0.4 mm, more preferably 0.4 to 0.8 mm.

The cross-sectional area of the pellicle frame bar in the present invention is preferably no greater than 6 mm$^2$, more preferably 1 to 6 mm$^2$, and more preferably at least 3 mm$^2$. By narrowing the width of the middle part of the pellicle frame as in the present invention, a small cross-sectional area can easily be achieved. By reducing the cross-sectional area in this way, deformation stress can be reduced, and as a result deformation of the mask can also be reduced.

With the area of the basic quadrilateral as 100%, the proportion of the cross-sectional area of the pellicle frame bar is preferably as small as possible since frame flatness and mask flatness can be improved. Specifically, it is preferably 25% to 85%, more preferably 35% to 75%, and yet more preferably 40% to 60%. It is preferable for the cross-sectional area of the pellicle frame bar to be in the above-mentioned range of values since frame and mask flatness can be enhanced while maintaining the strength necessary for the frame.

The pellicle frame of the present invention is preferably constituted from a material having a Young's modulus of 1 to 80 GPa.

As a material constituting the pellicle frame, aluminum, a magnesium alloy, a synthetic resin, etc. is preferably used, aluminum, a magnesium alloy, or a polycarbonate resin is more preferably used, and aluminum is especially preferably used.

As the aluminum, a conventionally used aluminum alloy material may be preferably used, and a JIS A7075, JIS A6061, JIS A5052 material, etc. may be more preferably used, but it is not particularly limited as long as it has the above-mentioned cross-sectional shape and the strength as a pellicle frame can be ensured. The surface of the pellicle frame is preferably roughened by sandblasting or chemical abrasion prior to a surface treatment such as coating with a polymer. In the present invention, the method for roughening the surface of the frame may employ a conventionally known method. It is preferable to employ a method for roughening the surface involving blasting the aluminum alloy material surface with stainless steel, carborundum, glass beads, etc., and further by chemically abrading with NaOH, etc.

The pellicle frame of the present invention may preferably be constituted from a material having a Young's modulus of 1 to 50 GPa instead of using a material having a high Young's modulus such as a conventionally commonly used aluminum alloy material of 69 GPa. As a material having a Young's modulus in the above range, a magnesium alloy of 44 GPa, an acrylic resin of 3 GPa, and a polycarbonate resin of 2.5 GPa can be cited as examples.

When such a material having a low Young's modulus is used, even if the cross-sectional area is 6 $mm^2$ to 12 $mm^2$, deformation stress of the pellicle frame can be reduced, and deformation of the mask can be suppressed.

The cross-sectional area of the pellicle frame bar of the present invention is preferably no greater than 12 $mm^2$.

When the cross-sectional area is 1 $mm^2$ to 6 $mm^2$, more preferably, when the cross-sectional area is 3 $mm^2$ to 6 $mm^2$, due to a synergistic effect the lower the Young's modulus of the material used, the more the deformation of the mask is suppressed.

In the present invention, the flatness of the pellicle frame is preferably at least 0 μm but no greater than 20 μm, and more preferably at least 0 μm but no greater than 10 μm.

When the flatness of the pellicle frame is good, the amount of deformation of the pellicle frame when affixing the pellicle to the mask can be reduced, and as a result the amount of deformation of the mask can be reduced.

The 'flatness' of the pellicle frame is a value obtained by measuring the height of 8 points at positions appropriately separated from each other on the pellicle frame, preferably a total of 8 points, that is, 1 point at each corner of the pellicle frame and 1 point in the middle of each of the 4 edges, calculating an imaginary plane, and subtracting the minimum point from the maximum point with respect to the distance of each point from the imaginary plane. The flatness of the pellicle frame may be measured by a 'laser displacement meter having an XY axis program stage', and in the present invention an above-mentioned displacement meter was used.

In the present invention, it is preferable to chamfer a corner, more preferably to C-chamfer a corner in the exposure master plate adhesion face and/or the pellicle film adhesion face of the pellicle frame between the inside and outside faces of the pellicle frame and the exposure master plate adhesion face and/or pellicle film adhesion face. C-chamfering means cutting an intersecting planes portion, that is, a corner, at 45°.

In the present invention, in order to absorb stray light, the pellicle frame preferably has a black oxide coating and/or a black polymer coating. Furthermore, when the pellicle frame is made of an aluminum alloy, the pellicle frame made from an aluminum alloy having a black anodized coating (a black almite coating) and/or a polymer electrodeposition-coated film is particularly preferable.

As a method for forming a black anodized coating on the pellicle frame surface, in general, after treating in a treatment bath of an alkali such as NaOH for a few tens of seconds, anodization is carried out in a dilute sulfuric acid aqueous solution, subsequently black staining and sealing treatments are carried out, and a black oxidized coating may thus be provided on the surface.

Furthermore, the polymer coating may be provided by various methods, and in general spray coating, electrostatic coating, electrodeposition coating, etc. can be cited as examples. In the present invention, it is preferable to provide the polymer coating by electrodeposition coating.

With regard to the electrodeposition coating, either a thermosetting resin or a UV curing resin may be used. It is also possible to employ either anionic electrodeposition coating or cationic electrodeposition coating for the resins. In the present invention, since UV resistance is also required, it is preferable to employ anionic electrodeposition coating of a thermosetting resin in terms of coating stability, appearance, and strength.

The lithographic pellicle of the present invention may be produced by stretching a pellicle film over one end face, that is, the upper edge, of any of the above-mentioned pellicle frames via a pellicle film adhesive, and providing an exposure master plate adhesive on the other end face, that is, the lower edge.

The type of pellicle film is not particularly limited and, for example, an amorphous fluorine polymer, etc. that has conventionally been used for an excimer laser may be used. Examples of the amorphous fluorine polymer include Cytop (product name, manufactured by Asahi Glass Co., Ltd.) and Teflon (Registered Trademark) AF (product name, manufactured by DuPont). These polymers may be used by dissolving them in a solvent as necessary when preparing the pellicle film, and may be dissolved as appropriate in, for example, a fluorine-based solvent.

EXAMPLES

The present invention is explained below more specifically by reference to Examples. A 'mask' in the Examples and Comparative Example is illustrated as an example of the 'exposure master plate' and, needless to say, application to a reticle can be carried out in the same manner.

The present invention is specifically explained below by way of Examples, but the present invention is not limited only to the Examples below.

Example 1

A 5% solution of Cytop CTX-S (product name, manufactured by Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature (25° C.) for 30 minutes and then at 180° C., thus giving a uniform film. An aluminum framework coated with an adhesive was affixed thereto, and only the film was peeled off, thus giving a pellicle film. The required number of Cytop CTX-S films were prepared and used in Examples 1 to 10 and the Comparative Example.

Figure 3:
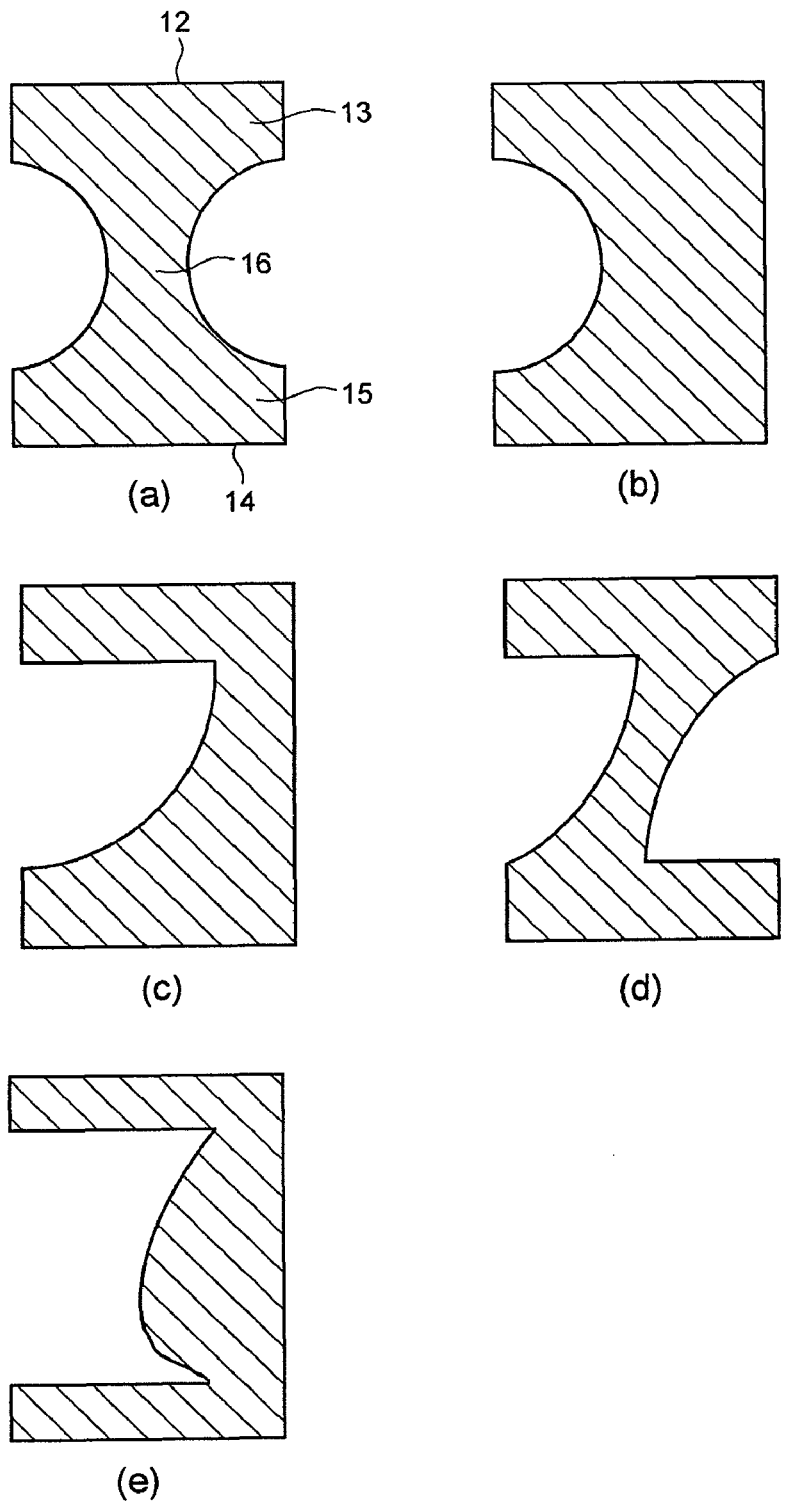
FIG. 3 A diagram showing a modified example of the cross-sectional shape of the pellicle frame bar.

A pellicle frame with outer dimensions of 149 mm×122 mm×3.5 mm and a width of the upper edge and lower edge of 2 mm was prepared from an aluminum alloy (also called an 'Al alloy') (the cross-sectional shape being shown in FIG. 3 (*a*), and the cross-sectional area being 4.33 $mm^2$). The cross-sectional shape was a shape obtained by removing a partial circle with a radius of 1.42 mm having a height of 2.5 mm and a width of 0.75 mm from central parts of opposite side faces of a rectangle having a height of 3.5 mm and a width of 2.0 mm. The thickness of the upper end part and lower end part was 0.5 mm, and the width of the middle part was also 0.5 mm. Four corners of the pellicle frame were subjected to C-chamfering.

When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.27 μm. Although the maximum deformation range changed by 48 nm, compared with a Comparative Example described below, it could be suppressed to a low value. The results of measurement of flatness and maximum deformation range are summarized in Table 1.

Mask flatness was measured using an UltraFlat (Tropel). Frame flatness was measured using a laser displacement meter having an XY axis program stage.

Furthermore, the 'maximum deformation range of the mask' is defined as the sum of the absolute values of the maximum change on +/− sides for the difference in height of each point of the mask when the profile of the mask is measured twice. When the mask is deformed due to affixing the pellicle, since the maximum deformation range becomes a large value even if the flatness does not change, the maximum deformation range is more effective as an index for mask deformation/distortion than flatness.

Example 2

A pellicle frame with outer dimensions of 149 mm×115 mm×3.0 mm and a width of the upper edge and lower edge of 2 mm was prepared from an aluminum alloy (the cross-sectional shape being shown in FIG. 3 (a), and the cross-sectional area being 3.79 mm$^2$). The cross-sectional shape was a shape obtained by removing a partial circle with a radius of 1.042 mm having a height of 2.0 mm and a width of 0.75 mm from central parts of opposite side faces of a rectangle having a height of 3.0 mm and a width of 2.0 mm. The thickness of the upper end part and lower end part was 0.5 mm at the end parts thereof, and the width of the middle part was also 0.5 mm. When the flatness of this frame was measured from the side that was to be coated with a mask pressure-sensitive adhesive, it was found to be 10 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.26 μm. Although the maximum deformation range changed by 36 nm, it could be suppressed to a very low value. The results of measurement of flatness and maximum deformation range are summarized in Table 1.

Example 3

A pellicle frame with outer dimensions of 149 mm×122 mm×3.5 mm and a width of the upper edge and lower edge of 2 mm was prepared from a magnesium alloy (also called an 'Mg alloy') (the cross-sectional shape being shown in FIG. 3 (a), and the cross-sectional area being 4.33 mm$^2$)), which has the same cross-sectional shape as that of Example 1. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the magnesium alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.24 μm. Although the maximum deformation range changed by 38 nm, it could be suppressed to a very low value. The results of measurement of flatness and maximum deformation range are summarized in Table 1.

Example 4

A pellicle frame with outer dimensions of 149 mm×122 mm×3.5 mm and a width of the upper edge and lower edge of 2 mm was prepared from a polycarbonate resin (also called an 'PC resin') (the cross-sectional shape being shown in FIG. 3 (a), and the cross-sectional area being 4.33 mm$^2$), which has the same cross-sectional shape as that of Example 1. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the polycarbonate resin frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be unchanged from 0.25 μm. Although the maximum deformation range changed by 27 nm, it could be suppressed to a very low value. The results of measurement of flatness and maximum deformation range are summarized in Table 1.

Example 5

A pellicle frame with outer dimensions of 149 mm×122 mm×3.5 mm and a width of the upper edge and lower edge of 2 mm was prepared from an aluminum alloy (the cross-sectional shape being shown in FIG. 3 (b), and the cross-sectional area being 4.55 mm$^2$). The cross-sectional shape was a shape obtained by removing a partial circle with a radius of 1.25 mm having a height of 2.5 mm and a width of 1.25 mm from central parts of opposite side faces of a rectangle having a height of 3.5 mm and a width of 2.0 mm. The thickness of the upper end part and lower end part was 0.5 mm at the end parts thereof, and the width of the middle part was 0.75 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.27 μm. Although the maximum deformation range changed by 52 nm, compared with the Comparative Example, it could be suppressed to a low value. The results of measurement of flatness and maximum deformation range are summarized in Table 1.

Example 6

A pellicle frame with outer dimensions of 149 mm×122 mm×3.5 mm and a width of the upper edge and lower edge of 2 mm was prepared from an aluminum alloy (the cross-sectional shape being shown in FIG. 3 (c), and the cross-sectional area being 5.23 mm$^2$). The cross-sectional shape was a shape obtained by removing a quarter circle with a radius of 1.5 mm having a height of 1.5 mm and a width of 1.5 mm from central parts of one side face of a rectangle having a height of 3.5 mm and a width of 2.0 mm. The thickness of the upper end part was 0.5 mm at one side edge thereof, and the width of the middle part was also 0.5 mm.

When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.28 μm. Although the maximum deformation range changed by 63 nm, compared with a Comparative Example described below, it could be suppressed to a low value. The results of measurement of flatness and maximum deformation range are summarized in Table 1.

Example 7

A pellicle frame with outer dimensions of 149 mm×122 mm×3.5 mm and a width of the upper edge and lower edge of 2 mm was prepared from an aluminum alloy (the cross-sectional shape being shown in FIG. 3 (d), and the cross-sectional area being 3.92 mm$^2$). The cross-sectional shape was a shape obtained by removing a half circle with a radius of 3.92 mm having a height of 2.5 mm and a width of 0.9 mm from one side face of a rectangle having a height of 3.5 mm and a width of 2.0 mm, and removing a half circle with a radius of 3.92 mm having the same size as the above-mentioned half circle to be upside down to each other from opposite side face of the rectangle. The thickness of the upper end part and lower end part was 0.5 mm at one side edge thereof, and the width of the middle part was also 0.5 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kgf. Subsequently, when the flatness of the pellicle-equipped mask was measured again, it was found to be 0.26 μm. Although the maximum deformation range changed by 37 nm, compared with a Comparative Example described below, it could be suppressed to a low value. The results of measurement of flatness and maximum deformation range are summarized in Table 1.

Example 8

A pellicle frame with outer dimensions of 149 mm×122 mm×3.5 mm and a width of the upper edge and lower edge of 2 mm was prepared from a polycarbonate resin (the cross-sectional shape being shown in FIG. 3 (d), and the cross-sectional area being 3.92 mm$^2$), which has the same cross-sectional shape as that of Example 7. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be unchanged from 0.25 μm. Although the maximum deformation range changed by 26 nm, compared with a Comparative Example described below, it could be suppressed to a low value. The results of measurement of flatness and maximum deformation range are summarized in Table 1.

Comparative Example

A pellicle frame with outer dimensions of 149 mm×122 mm×3.5 mm and a width of the upper edge and lower edge of 2 mm was prepared from an aluminum alloy (the cross-sectional shape being a rectangular, and the cross-sectional area being 7.00 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it changed to 0.29 μm. Furthermore, the maximum deformation range was changed greatly to 100 nm.

The results above are all as shown in Table 1 below.

TABLE 1

| Examples and Comp. Ex. | Pellicle Frame | | | | | | Measurement value | | | |
|---|---|---|---|---|---|---|---|---|---|---|
| | Cross-sectional shape | Width of upper and lower edges (mm) | Height (mm) | Cross-sectional area (mm²) | Material | Young's Modulus (GPa) | Frame flatness (μm) | Mask flatness | | Maximum deformation range (nm) |
| | | | | | | | | Before affixing (μm) | After affixing (μm) | |
| Example 1 | a | 2 | 3.5 | 4.33 | Al alloy | 69 | 20 | 0.25 | 0.27 | 48 |
| Example 2 | a | 2 | 3.0 | 3.79 | Al alloy | 69 | 10 | 0.25 | 0.26 | 36 |
| Example 3 | a | 2 | 3.5 | 4.33 | Mg alloy | 44 | 20 | 0.25 | 0.24 | 38 |
| Example 4 | a | 2 | 3.5 | 4.33 | PC resin | 2.5 | 20 | 0.25 | 0.25 | 27 |
| Example 5 | b | 2 | 4.5 | 4.55 | Al alloy | 69 | 20 | 0.25 | 0.27 | 52 |
| Example 6 | c | 2 | 3.5 | 5.23 | Al alloy | 69 | 20 | 0.25 | 0.28 | 63 |
| Example 7 | d | 2 | 3.5 | 3.92 | Al alloy | 69 | 20 | 0.25 | 0.26 | 37 |
| Example 8 | d | 2 | 3.5 | 3.92 | PC resin | 2.5 | 20 | 0.25 | 0.25 | 26 |
| Comp. Ex. | Rectangle | 2 | 3.5 | 7.00 | Al alloy | 69 | 20 | 0.25 | 0.29 | 100 |

Al alloy: an aluminum alloy
Mg alloy: a magnesium alloy
PC resin: a polycarbonate resin

The invention claimed is:

1. A pellicle frame comprising a pellicle frame bar having a cross-section with a shape that has a curved line-containing recess in at least one side edge of a quadrilateral having an upper edge and a lower edge parallel to each other and a cross-sectional area of no greater than 20 mm².

2. The pellicle frame according to claim 1, wherein the quadrilateral is a rectangle and the curved line is selected from convex curved lines formed from a circle, an ellipse, a hyperbola, and a parabola.

3. The pellicle frame according to claim 1, wherein the recess is formed only from a convex curved line.

4. The pellicle frame according to claim 1, wherein the recess includes at least one straight line.

5. The pellicle frame according to claim 4, wherein the recess includes at least one straight line parallel to the upper edge of the quadrilateral.

6. The pellicle frame according to claim 1, wherein the pellicle frame bar has a cross-sectional area of at least 1 mm² but no greater than 6 mm².

7. The pellicle frame according to claim 1, wherein the pellicle frame bar is formed from a material having a Young's modulus of 1 to 80 GPa.

8. The pellicle frame according to claim 1, wherein the pellicle frame bar is formed from a material selected from the group consisting of an aluminum alloy, a magnesium alloy, and a polycarbonate resin.

9. The pellicle frame according to claim 1, wherein the pellicle frame bar is formed from an aluminum alloy.

10. The pellicle frame according to claim 1, wherein the quadrilateral has an area of at least 4 mm² but no greater than 20 mm².

11. The pellicle frame according to claim 1, wherein the pellicle frame has a flatness of at least 0 μm but no greater than 20 μm.

12. A lithographic pellicle comprising a pellicle film stretched over one end face of the pellicle frame according to claim 9 via a pellicle film adhesive, and comprising an exposure master plate adhesive on the other end face.

13. A lithographic pellicle comprising a pellicle film stretched over one end face of the pellicle frame according to claim 1 via a pellicle film adhesive, and comprising an exposure master plate adhesive on the other end face.

14. A lithographic pellicle comprising a pellicle film stretched over one end face of the pellicle frame according to claim 2 via a pellicle film adhesive, and comprising an exposure master plate adhesive on the other end face.

15. A lithographic pellicle comprising a pellicle film stretched over one end face of the pellicle frame according to claim 3 via a pellicle film adhesive, and comprising an exposure master plate adhesive on the other end face.

16. A lithographic pellicle comprising a pellicle film stretched over one end face of the pellicle frame according to claim 4 via a pellicle film adhesive, and comprising an exposure master plate adhesive on the other end face.

17. A lithographic pellicle comprising a pellicle film stretched over one end face of the pellicle frame according to claim 5 via a pellicle film adhesive, and comprising an exposure master plate adhesive on the other end face.

18. A lithographic pellicle comprising a pellicle film stretched over one end face of the pellicle frame according to claim 6 via a pellicle film adhesive, and comprising an exposure master plate adhesive on the other end face.

19. A lithographic pellicle comprising a pellicle film stretched over one end face of the pellicle frame according to claim 7 via a pellicle film adhesive, and comprising an exposure master plate adhesive on the other end face.

20. A lithographic pellicle comprising a pellicle film stretched over one end face of the pellicle frame according to claim 8 via a pellicle film adhesive, and comprising an exposure master plate adhesive on the other end face.

* * * * *